(12) United States Patent
Granneman et al.

(10) Patent No.: US 7,312,156 B2
(45) Date of Patent: *Dec. 25, 2007

(54) METHOD AND APPARATUS FOR SUPPORTING A SEMICONDUCTOR WAFER DURING PROCESSING

(75) Inventors: Ernst Hendrik August Granneman, Ad Hilversum (NL); Frank Huussen, Pe Bilthoven (NL)

(73) Assignee: ASM International N.V. (NL)

( * ) Notice: Subject to any disclaimer, the term of this patent is extended or adjusted under 35 U.S.C. 154(b) by 251 days.

This patent is subject to a terminal disclaimer.

(21) Appl. No.: 10/932,633

(22) Filed: Sep. 1, 2004

(65) Prior Publication Data

US 2005/0037619 A1    Feb. 17, 2005

Related U.S. Application Data

(63) Continuation of application No. 10/603,515, filed on Jun. 24, 2003, now Pat. No. 6,805,749, which is a continuation of application No. 09/717,702, filed on Nov. 20, 2000, now Pat. No. 6,613,685, which is a continuation of application No. 09/227,564, filed on Jan. 8, 1999, now Pat. No. 6,183,565, which is a continuation-in-part of application No. PCT/NL97/00398, filed on Jul. 8, 1997.

(51) Int. Cl.
*H01L 21/302* (2006.01)
(52) U.S. Cl. .................. 438/711; 438/714; 438/715; 438/716; 438/762; 438/767
(58) Field of Classification Search ............ 438/715, 438/762, 764, 767, 711, 714, 716
See application file for complete search history.

(56) References Cited

U.S. PATENT DOCUMENTS 3,854,443 A    12/1974 Baerg (Continued)

FOREIGN PATENT DOCUMENTS

EP    0 657 918 A2    11/1994

(Continued)

OTHER PUBLICATIONS

Thermal Conductivity of Gas; Inorganic Compound (for argon and silane); Chemical Properties Handbook, (via www.knovel.com); 1999 McGraw-Hill.*

(Continued)

*Primary Examiner*—Binh X. Tran
(74) *Attorney, Agent, or Firm*—Knobbe Martens Olson & Bear LLP

(57) ABSTRACT

A semiconductor wafer is processed while being supported without mechanical contact. Instead, the wafer is supported by gas streams emanating from a large number of passages in side sections positioned very close to the upper and lower surface of the wafer. The gas heated by the side sections and the heated side sections themselves quickly heat the wafer to a desired temperature. Process gas directed to the "device side" of the wafer can be kept at a temperature that will not cause deposition on that side section, but yet the desired wafer temperature can be obtained by heating non-process gas from the other side section to the desired temperature. A plurality of passages around the periphery of the wafer on the non-processed side can be employed to provide purge gas flow that prevents process gas from reaching the non-processed side of the wafer and the adjacent area of that side section.

25 Claims, 2 Drawing Sheets

U.S. PATENT DOCUMENTS

| | | |
|---|---|---|
| 3,947,236 A | 3/1976 | Lasch, Jr. |
| 4,495,024 A | 1/1985 | Bok |
| 4,560,590 A | 12/1985 | Bok |
| 4,574,093 A | 3/1986 | Cox |
| 4,575,408 A | 3/1986 | Bok |
| 4,622,918 A | 11/1986 | Bok |
| 4,662,987 A | 5/1987 | Bok |
| 4,738,748 A | 4/1988 | Kisa |
| 4,860,687 A | 8/1989 | Frijlink |
| 4,903,717 A | 2/1990 | Sumnitsch |
| 4,903,754 A | 2/1990 | Hirscher et al. |
| 4,958,061 A | 9/1990 | Wakabayashi et al. |
| 5,033,538 A | 7/1991 | Wagner et al. |
| 5,090,900 A | 2/1992 | Rudolf et al. |
| 5,180,000 A | 1/1993 | Wagner et al. |
| 5,221,403 A | 6/1993 | Nozawa et al. |
| 5,318,801 A | 6/1994 | Snail et al. |
| 5,352,294 A | 10/1994 | White et al. |
| 5,356,476 A | 10/1994 | Foster et al. |
| 5,382,311 A | 1/1995 | Ishikawa et al. |
| 5,431,700 A | 7/1995 | Sloan |
| 5,447,431 A | 9/1995 | Muka |
| 5,520,538 A | 5/1996 | Muka |
| 5,542,559 A | 8/1996 | Kawakami et al. |
| 5,574,247 A * | 11/1996 | Nishitani et al. ........... 118/708 |
| 5,738,165 A | 4/1998 | Imai |
| 5,772,770 A | 6/1998 | Suda et al. |
| 5,778,968 A | 7/1998 | Hendrickson et al. |
| 5,891,251 A * | 4/1999 | MacLeish et al. ........... 118/719 |
| 6,066,204 A * | 5/2000 | Haven ......................... 117/89 |
| 6,113,703 A * | 9/2000 | Anderson et al. ........... 118/725 |
| RE36,957 E | 11/2000 | Brors et al. |
| 6,613,685 B1 * | 9/2003 | Granneman et al. ........ 438/710 |

FOREIGN PATENT DOCUMENTS

| | | |
|---|---|---|
| GB | 2 181 458 A | 10/1986 |
| JP | 361294812 A | 12/1986 |
| JP | 362021237 A | 1/1987 |
| JP | 63136532 A | 6/1988 |
| JP | 402034915 A | 2/1990 |
| JP | 404078130 A | 3/1992 |
| NL | 8103979 | 3/1983 |
| NL | 8200753 | 9/1983 |
| NL | 8203318 | 3/1984 |
| NL | 8402410 | 3/1986 |
| WO | WO 90/13687 | 11/1990 |
| WO | WO-95/16800 | 6/1995 |
| WO | WO-98/01890 | 1/1998 |

OTHER PUBLICATIONS

As cited in the Int'l Search Report. Japan—Patent Abstracts of Japan; vol. 9, No. 85 (E-308), Apr. 13, 1984 & JP 59 2125718 A (Kokusai Denki KK) Dec. 5, 1984; Publication No. 59215718; Publication date May 12, 1984.

CRC Hand Book of Chemistry and Physics 3$^{rd}$ electronic edition, CRC Press Inc. p;ublish 2000, p. 6-175.

Chemical Properties Handbook (access via www.knovel.com) McGraw-Hill Companies, 1999.

Yoo et al., "Low-temperature annealing system for 300 mm thermal processing," Solid State Technology, Jun. 2001, pp. 152-160.

* cited by examiner

METHOD AND APPARATUS FOR SUPPORTING A SEMICONDUCTOR WAFER DURING PROCESSING

RELATED APPLICATIONS

This application is a continuation of U.S. application Ser. No. 10/603,515, filed Jun. 24, 2003, now U.S. Pat. No. 6,805,749 which is a continuation of U.S. application Ser. No. 09/717,702, filed Nov. 20, 2000 (now U.S. Pat. No. 6,613,685 B1, issued Oct. 2, 2003), which is a continuation of U.S. application Ser. No. 09/227,564, filed Jan. 8, 1999 (now U.S. Pat. No. 6,183,565, issued Feb. 6, 2001), which is a continuation-in-part of International application No. PCT/NL97/00398, filed Jul. 8, 1997, which claims priority from Netherlands Patent Appln. No. 1003538, filed Jul. 8, 1996.

BACKGROUND OF THE INVENTION

The present invention relates to a method for contactless treatment of a substrate such as a semiconductor wafer, comprising enclosing the wafer in an apparatus and applying two gas streams, in opposing directions, from first and second side sections located opposite on another, to the two opposing planar sides or surfaces of the wafers.

A method of this general type is disclosed in Netherlands Laid Open Application 8402410, in which furthermore, reference is made to Netherlands laid Open Applications 8103979, 8200753 and 8203318.

From these publications it is known to position a wafer such that it is floating between the two side sections. If the gas flow is suitably chosen, it has been found that a highly accurate definition of the position of the wafer with respect to the side sections is possible and this position is relatively fixed, that is to say little variation occurs in the position of the wafer with respect to the side sections. In the patent publications concerned it is described that the wafer is subjected to a wet treatment and is then possibly dried. For the purposes of drying, the gas which holds the wafer in place is heated to about 100° C. and is moved over the surface of the wafer, as a result of which the moisture present is automatically removed.

Heating to much higher temperatures in the range of 200°-1200° C. is frequently necessary when treating semiconductor substrates. Heating can involve annealing or raising the temperature to make deposition or other processes possible. In the prior art, wafers are to this end placed in furnaces and then heated. Although this method is adequate, it has at least two disadvantages. Firstly, a method of this type is usually not completely contactless, that is to say certain points of the wafer are supported. Secondly, it takes a relatively long time to heat a wafer. This is due not so much to the thermal capacity of the wafer itself as to the relatively slow heat transfer between the furnace and the wafers and to the fact that in order to achieve a controlled, deformation free heating of the wafers, the wafers need to be heated inside the furnace together with the furnace itself.

In order to solve this problem single wafer systems have been disclosed with which rapid heating was achieved with the aid of high power lamps (50-80 Kw). Such a method is particularly expensive and difficult to control.

U.S. Pat. No. 4,622,918 discloses an apparatus wherein a wafer is fed through between a number of columns located some distance apart. Sets of columns located opposite one another, between which the wafer moves, are likewise some distance apart. In the gap between the sets of columns, heating is effected by means of a lamp some distance away. This apparatus has the drawback that due to the presence of many metal parts with complicated constructions in close proximity to the wafer, only heating to limited temperatures is possible. Furthermore, in this apparatus a wafer is supported by a plurality of columns of air streams with gaps in between the columns. Due to the succession of columns, where the wafer is supported, and gaps between the columns where the wafer is exposed to the heat radiation of the lamps, both the support of the wafer and the heating are not homogeneous.

It has been found that only limited heating can take place effectively by heating the gases, as is described in the above-mentioned Netherlands applications.

SUMMARY OF THE INVENTION

The aim of the present invention is to provide a method with which contactless heating of semiconductor substrates to relatively high temperature within a relatively short time is possible.

This aim is achieved by enclosing a wafer between relatively massive side sections of an apparatus and applying gas streams to opposite planar sides of a wafer. Preferably the side sections include plates having a minimum thickness of about 10 mm with the spacing between each of the side sections and the wafer to be at most about 1.0 mm. Further, at least one of the side sections is heated to a temperature higher than 200° C.

Surprisingly, it has been found that if the spacing between the side sections, or between side section and wafer, is set to be relatively small, particularly rapid heat transfer can take place. It is possible to achieve heating to far about 1000° C. within a few seconds. Because with this arrangement the wafer, in principle, does not have to be supported, but is held accurately and definitively in its place by the gas streams, the wafer will also not be subjected to stresses generated by local temperature differences and distortion will be prevented as far as possible. Incidentally, it is pointed out that if a slight degree of distortion does take place, the stabilizing effect of the gas streams in opposing directions is such that the wafer is pressed straight in a 'gentle' manner without damage.

Therefore, it is now possible to keep the apparatus at the process temperature and load the wafer while the side sections are at process temperature without damage for the wafer. As a consequence, a particularly small peak power is needed to achieve such rapid heating of wafer because the energy required to heat the wafer is withdrawn from the side sections. It will be understood that the method described above is outstandingly suitable for processes in which wafers are treated one-by-one ('single wafer processing'). However, it is also possible to treat large numbers of wafers one after the other or parallel to one another in the manner described above.

Introduction of the wafer into the enclosing apparatus described above can be effected in any way known from the prior art. A particularly simple method is that in which the side sections can be moved apart. The wafer can be placed between the side sections when the latter have been apart. Supporting means can optionally be present to fix the wafer in such a position. The side sections then move towards one another and the function of the supporting means can be taken over by the gas stream moving out of the side sections concerned. As a result, the wafer moves away from the supporting means.

Apart from heating the semiconductor substrate in this way it is also possible to carry out treatments on the substrate, such as oxidation, etching or the deposition of layers. to this end it is possible to mix a gaseous medium with the gas which holds the wafer in its place. Of course, it is also possible to position the wafer using process gas only. This is in contrast to what is described and suggested in the above-mentioned Netherlands Applications, where only wet treatment of the related substrate takes place. This process gas can be supplied, uniformly distributed, from one of the side sections, such that a uniform distribution over the related wafer surface takes place.

One of the problems encountered in the prior art when supplying process gas at elevated temperature and more particularly when depositing layers is that the apparatus and more particularly when depositing layers is that the apparatus used to supply the process gas becomes contaminated by deposition of the material concerned from the process gas. This means that apparatuses of this type have to be cleaned regularly and that major problems arise with regard to clogging.

With the method according to the invention it is possible to prevent these problems. This is because, according to a further embodiment of this method, a temperature difference is applied over the wafer. One of the side sections is heated to a relatively high temperature, whilst the other of the side sections is heated to a relatively low temperature. It has been found that, as a result of the thermal behavior of the enclosing apparatus, the wafer will assume a temperature which is dependent on the position of the wafer with respect to the two heated side sections. If the two side sections are equidistant from the wafer and the same gas is present on both sides, the temperature will fairly accurately be the average of the values of the temperatures of each of the side sections.

If, by controlling one or both gas streams, the wafer is not located centrally between the two side sections, the temperature will change correspondingly.

If different types of gas are used, that is to say gases having different thermal conduction properties, a change in temperature will likewise take place. For example, when argon is used on one side and hydrogen is used on the other side it has been found that transfer between the relevant side section and the wafer is ten times between on the side where hydrogen is supplied.

Consequently, by means of a suitable choice of the temperatures concerned, it is possible to provide the side section from which the process gas is emitted with a temperature such that no deposition takes place on such side section, whilst the wafer is at a temperature which is so much higher that deposition does take place on such wafer.

It has been found that the rate of deposition of, for example, polysilicon from silane on a substrate is lower by a factor of 350 at 700 K and a partial pressure of 0.4 torr than at 900 K. This means that by controlling the temperature, deposition is negligible on the side section from which the process gas is supplied and which is at low temperature.

With this arrangement it is possible, in the starting position, to place the wafer with the 'device side' of the wafer towards the side section which is at the lowest temperature, through which side section the process gas is subsequently supplied. As a result of supplying the reactive gases, the wafer is moved towards the side section at the higher temperature and, on assuming the higher temperature, deposition accordingly, takes place. The reverse set-up is also possible. That is to say, the side section from which the gas emanates is at a higher temperature than the opposite side section. In this case, the 'device side' of the wafer faces the side section which is at the lower temperature and the Bernoulli principle can be used by allowing the correct gas stream to flow against the top of the wafer. With this arrangement a reduced pressure is created beneath the wafer, which reduced pressure ensures that the wafer will float (in a stable manner) beneath the top side section. The hot (bottom) side section is then raised until the process situation is achieved.

It has been found that appreciable temperature differences between the related side section and the wafer are possible using the construction described above. A value of at least 150° C. and more particularly 200° C. may be mentioned by way of example.

With the method according to the invention, these values can be set very accurately. After all, it has been found that these values are mainly dependent on the position of the wafer in the enclosing apparatus. As already indicated above, the position of the wafer in the tunnel-like apparatus is accurately related to the quantity and type of gas supplied from the related side sections.

The invention also relates to an apparatus with which the above method can be carried out in all its alternative embodiments. In this apparatus at least one of the side sections is provided with heating means for heating the section(s) to above 250° C. It has been found that relatively small peak power is needed to achieve relatively fast heating of a wafer. It is in particular the high thermal capacity of the side section concerned, which is of importance for the stability of the process.

The related side section can be provided with a number of spaced gas feed channels in order to provide uniform metering of the gas and more particularly process gas.

In a simple embodiment which is particularly suitable for deposition purposes, a very large number of injection points must be present. A construction of this type can, for example, be achieved by providing porous plates.

The invention will be explained below with reference to an illustrative embodiment shown in the drawing. In the drawing:

DETAILED DESCRIPTION OF THE PREFERRED EMBODIMENT

Figure 1:
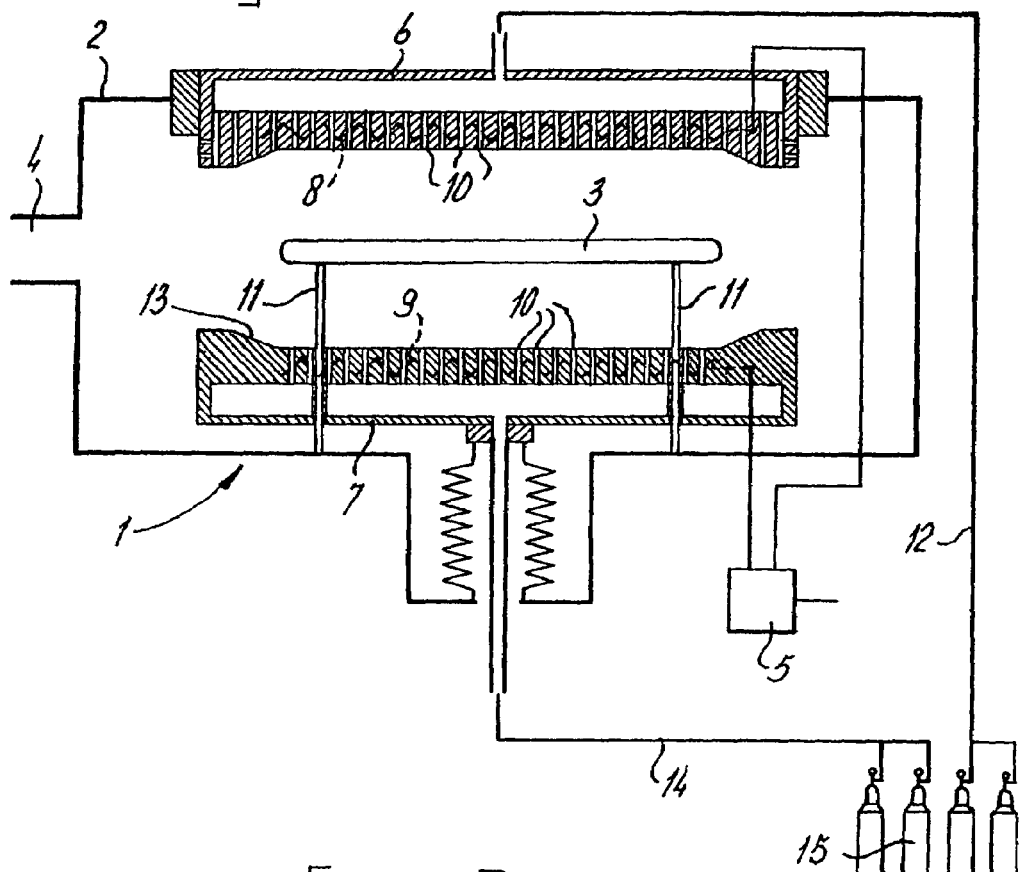
FIG. 1 shows diagrammatically, an apparatus according to the invention in the position in which the semiconductor substrate is introduced.

In FIG. 1, the apparatus according to the invention is indicated in its entirety by 1. This apparatus is provided with an inlet 4, which can be connected, in a manner not shown in more detail, to a 'load lock' or a cluster system for further treatment of semiconductor substrates.

The actual apparatus according to the invention, consisting of top and bottom or first and second side sections 6 and 7, respectively, is accommodated in a pressure vessel 2 for carrying out a process in a specific environment or under elevated or reduced pressure.

The first side section 6 is joined rigidly to the pressure vessel 2. A heating coil 8, which is connected to a control 5, is mounted inside the first side section. A gas supply line 12 is also present, which gas supply line is connected to the gas feeds 10 which comprise a number of uniformly distributed passages.

It must be understood that in practice a very much larger number of passages will generally be used, which passages are each very much smaller than is shown. For the sake of clarity, the various features have been shown in exaggerated form in the drawing. It is desirable that there be at least 20 holes for a 200 mm diameter wafer and preferably there would be about 64. With a larger wafer there should of course be more passages. The hole diameter should be no greater than about 2 mm, and preferably is about 0.25 mm.

Side section 6 is provided at its periphery with centering chamfers 13. As can be seen from FIG. 2, these serve for enclosure of a semiconductor substrate or wafer 3 by extending beyond the periphery of the wafer.

Second side section 7 is constructed correspondingly. Supporting pins 11 for supporting the semiconductor substrate extend through the second side section 7.

Figure 2:
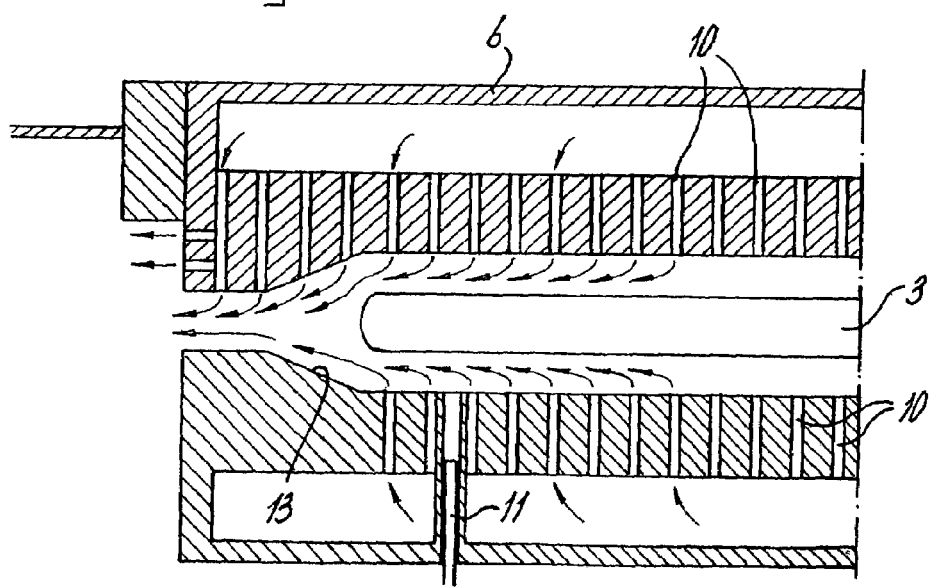
FIG. 2 shows part of the apparatus after introduction of the semiconductor substrate.

As can be seen from FIG. 2, the various features are so dimensioned that when the two side sections are in the closed position, that is to say in the position in which the spacing between each of the sections and the wafer is set to be at most about 1 mm, the semiconductor substrate 3 is no longer supported by the supporting pins 11 but by the gas streams which flow through the holes 10 towards the semiconductor substrate 3 from both side sections.

It will be understood that the various features are dependent on the application concerned.

Gas passages 10 in the second side section 7 are connected to a gas supply line 14, which is connected to a source 15.

The apparatus described above functions as follows:

Starting from the situation shown in FIG. 1, the wafer 3 is placed on the supporting pins 11, as is also shown in FIG. 2. The second side section 7 is then moved up and the situation as shown in FIG. 2 is obtained. The wafer 3 is accurately positioned in the center between the two side sections 6 and 7 by the gas streams issuing from the passages 10 in the two side sections. Deviation in the position is possible by means of adjusting the gas flow.

Figure 3:
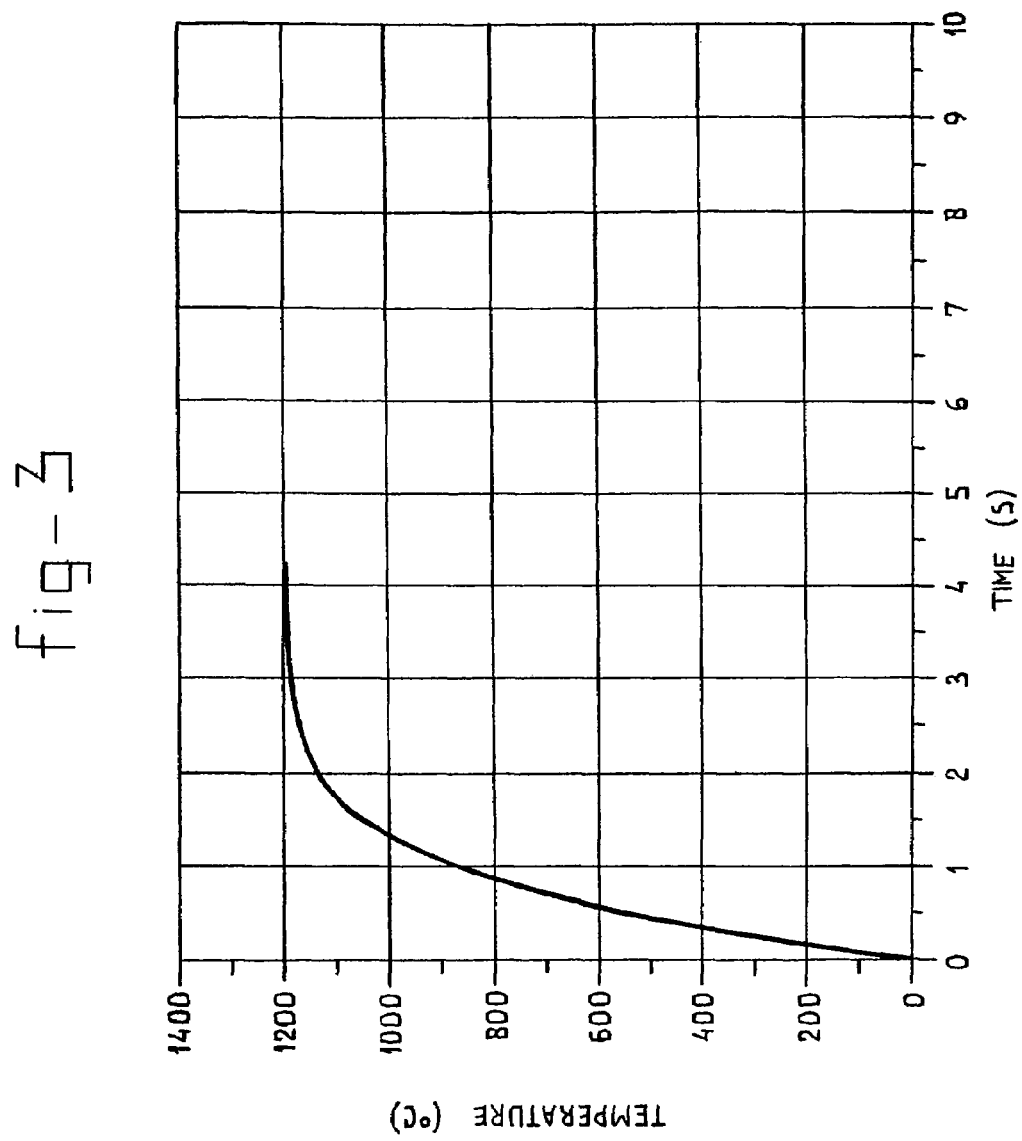
FIG. 3 shows a graph in which the rate of heating of the semiconductor substrate is shown for the apparatus according to FIGS. 1 and 2.

The side sections are preferably formed by relatively massive plates so as to have high heat capacity. Plates should have a minimum thickness of about 10 mm, and preferably about 60 mm. The side sections are heated by the heating elements 8 and 9, and it has been found that this heat is transferred to the wafer with negligible loss. In practice, it has been found that almost immediately after it enters the gap between the side sections 6 and 7 the wafer assumes the temperature thereof. This is in a situation in which the temperature of the side sections 6 and 7 is identical. Such an example is shown in FIG. 3. In this case both side sections have been heated to a temperature of approximately 1200° C. It has been found that the wafer 3 has the same temperature within four seconds. Because the wafer 3 is not supported and is heated uniformly, no thermal stresses will be produced, as a result of which there is no question of distortion.

At such an elevated temperature it is possible to anneal the wafer or to carry out an oxidizing reducing treatment. In the latter case the relevant gases are supplied as process gases through the passages 10.

Apart from furnaces, radiation lamps are also used in the prior art, the wafer being positioned on a bearing surface. Apart from the above-mentioned risk of distortion as a result of non-uniform heating caused by removal of heat to the support point, the heating rate is relatively slow. Values of 5-10°/s are not uncommon if the wafer is on a susceptor. In all other cases,m values of 50-100°/s have been found.

In certain cases it is, however, desirable to subject the wafer to a deposition treatment. The case in which a process gas, from which material has to deposit on the wafer, is present in source 15 is chosen as an example here. To prevent the passages 10 in the second side section 7 from becoming clogged by premature deposition of material from the process gas concerned, it is proposed to bring the first side section 6 to a relatively high temperature and the second side section 7 to a relatively low temperature with the aid of control 5.

If, for example, for polysilicon the deposition temperature of material from the silane gas issuing from source 15 is 625° C. (900 K), it is proposed to heat the first side section 6 to a temperature of 1100 K and the second side section 7 to a temperature of approximately 700 K. At 700 K virtually no deposition of material from the gas will take place, so that the passages 10 concerned will not clog. However, the wafer is found accurately to assume a temperature which is midway between that of the first side section 6 and that of the second side section 7, this being the desired temperature of 900 K. As a result of the flow of the gases shown (FIG. 2), it is largely precluded that gas issuing from the second side section 7 will enter the first hot side section 6 and deposit there. In any event it has not been found that passages 10 in the first side section 6 clog.

In the case of a deposition treatment of this type it is not uncommon first to supply an inert gas and then to supply the treatment gas. This is represented symbolically by showing a number of gas bottles at 15 and the quantity or mixing ratio or type of gas supplied to the line 12 or 14 can be controlled by means of control means, which are not shown in more detail.

Close to the end sections of the side sections, the upper side section is provided with a large number of gas passages, whilst this it not the case for side section 7. In this way an accurately controlled gas purge flowing radially outwards can be provided and deposition on section 6 prevented.

If the side section 7 is at a lower temperature, it is not necessary to use the pins described above. The wafer can be placed directly on side section 7. In such a case it is not even desirable to use pins, because in a set-up of this type the 'device side' faces downwards.

It has been found that a very small amount of gas is needed with the method described above. An amount of between 0.1 and 25 litres per second under standard conditions under a pressure in the vessel which is between 1 torr and 1 atom may be mentioned here as an example. The various aspects are wholly dependent on the process conditions.

When the treatment is complete, the side sections can be moved away from one another again and the wafer removed. Cooling takes place equally as rapidly as heating without any damage over the entire extent of the wafer.

It must be understood that the relative sizes shown in the figures are incorrect and have been introduced for the sake of clarity. Thus, the diameter of a typical wafer is approximately 150-200 mm and the thickness approximately 0.7 mm. The distance between a wafer and the surface of the relevant side sections from which gases issue is of the order of magnitude of one or a few tenths of millimeters.

It is possible to impose a rotary movement on the wafer, as a result of which an even more uniform treatment is provided.

Such a rotation can, for example, be achieved by positioning one or more of the channels 10 at an angle with respect to the vertical, as a result of which a spiral gas flow is generated.

These and further variants are obvious to a person skilled in the art after reading the above description and fall within the scope of the appended claims.

We claim:

1. A method for treatment of a substrate, comprising:
   placing the substrate between first and second side sections of an apparatus, the first and second side sections extending completely across opposite surfaces of the substrate;
   maintaining the first side section at a first temperature and the second side section at a second temperature;
   allowing thermal transfer among the side sections and the substrate, thereby heating the substrate to a third temperature between the first and second temperatures while the substrate is positioned between the side sections; and
   conducting a semiconductor fabrication treatment upon the substrate with a reactive gas that is reactive at the first temperature but non-reactive at the second temperature,
   wherein at least one of the first temperature and the second temperature is at least 200° C.

2. The method of claim 1, further comprising applying gas streams in opposing directions from the first and second side sections to suspend the substrate without contacting the first and the second sections.

3. The method of claim 1, wherein maintaining the first side section at a first temperature and the second side section at second temperature comprises heating the first side section and the second section with heating coils.

4. The method of claim 1, further comprising heating the substrate to a fourth temperature by flowing a reactive gas for conducting a semiconductor fabrication treatment.

5. The method of claim 1, wherein the semiconductor fabrication treatment is selected from the group consisting of oxidation, etching and deposition.

6. The method of claim 5, wherein deposition comprises chemical vapor deposition.

7. The method of claim 1, wherein conducting a semiconductor fabrication treatment comprises flowing the reactive gas out from passages in the first side section.

8. The method of claim 7, wherein conducting a semiconductor fabrication treatment comprises flowing gas having different thermal conduction properties on opposite sides of the substrate.

9. The method of claim 1, wherein the first and second temperatures establish a thermal gradient between the first and the second sections.

10. The method of claim 9, wherein the third temperature is an average of the first and second temperatures.

11. A process for semiconductor fabrication, comprising:
    loading a substrate between top and bottom plates of a single substrate reaction chamber, the top and bottom plates extending across an entire area of the substrate;
    heating the top plate to a first temperature and the bottom plate to a second temperature different from the first temperature to establish a thermal gradient between the top and bottom plates;
    suspending the substrate between the top and bottom plates on gas cushions;
    heating the substrate by transferring heat from each of the top and bottom plates to the substrate; and
    subjecting the substrate to a chemical vapor deposition in the reaction chamber.

12. The process of claim 11, wherein at least one of the plates is heated to at least 250° C.

13. The process of claim 11, wherein suspending the substrate comprises flowing gas out of the top and bottom plates to the substrate.

14. The process of claim 11, wherein subjecting the substrate to the chemical vapor deposition comprises depositing polysilicon.

15. The process of claim 11, wherein subjecting the substrate to the chemical vapor deposition comprises positioning the substrate no more than about 1 mm from the top or the bottom plates.

16. The method of claim 11, wherein a difference the substrate and one of the first and second temperatures is at least 150° C.

17. The process of claim 11, wherein the plates each have a minimum thickness of about 10 mm.

18. The process of claim 17, wherein the minimum thickness is about 60 mm.

19. A method for semiconductor processing, comprising:
    providing a reactor having top and bottom sections;
    positioning a wafer between the top and bottom sections, the top and bottom sections extending completely over major surfaces of the wafer;
    maintaining a temperature gradient between the top and bottom sections by heating the top and bottom sections, wherein at least one of the sections is heated to at least 250° C., wherein temperatures of each the top and bottom sections are variable based upon a desired wafer temperature;
    flowing gas between the top section and the wafer and between the bottom section and the wafer, wherein the gas is reactive at a temperature of the top section and non-reactive at a temperature of the bottom section; and
    chemical vapor depositing a material on a major surface of the wafer.

20. The method of claim 19, wherein flowing gas comprises flowing the gas out from passages extending through the top and the bottom sections.

21. The method of claim 19, wherein gas directly contacts top and bottom surfaces of the wafer.

22. The method of claim 19, wherein gas contacting the major surface has a higher thermal conductivity than gas flowing between an other major surface of the wafer and one of the top or the bottom sections.

23. The method of claim 19, wherein a temperature of the wafer is an average of the temperature of the top section temperature and the temperature of the bottom section.

24. The method of claim 19, wherein a temperature difference between the wafer and one of the sections is at least 150° C.

25. The method of claim 24, wherein the temperature difference is at least 200° C.

* * * * *

UNITED STATES PATENT AND TRADEMARK OFFICE
CERTIFICATE OF CORRECTION

PATENT NO. : 7,312,156 B2 Page 1 of 1
APPLICATION NO. : 10/932633
DATED : December 25, 2007
INVENTOR(S) : Granneman et al.

It is certified that error appears in the above-identified patent and that said Letters Patent is hereby corrected as shown below:

Title page 2, column 2, under "Other Publications, line 6, please replace "p;ublish" with -- publish --

At column 3, line 4, please replace "layers. to" with -- layers. To --

At column 6, line 3, please replace "cases,m" with -- cases, m --

In Claim 16, column 8, line 19, please replace "where a difference the substrate" with -- wherein a temperature difference between the substrate --

Signed and Sealed this

Tenth Day of June, 2008

JON W. DUDAS
*Director of the United States Patent and Trademark Office*